United States Patent [19]

Nelson

[11] Patent Number: 4,755,741
[45] Date of Patent: Jul. 5, 1988

[54] ADAPTIVE TRANSISTOR DRIVE CIRCUIT

[75] Inventor: Carl T. Nelson, San Jose, Calif.

[73] Assignee: Linear Technology Corporation, Milpitas, Calif.

[21] Appl. No.: 932,014

[22] Filed: Nov. 18, 1986

[51] Int. Cl.[4] .............................................. G05F 1/44
[52] U.S. Cl. .................................... 323/289; 323/285; 307/297; 330/296
[58] Field of Search .............. 323/222, 282, 284, 285, 323/289; 307/296 R, 297, 300, 280; 330/267, 296

[56] References Cited

U.S. PATENT DOCUMENTS

| | | | |
|---|---|---|---|
| 4,228,404 | 10/1980 | Widlar | 330/267 |
| 4,564,769 | 1/1986 | Melamed | 307/300 |
| 4,595,974 | 6/1986 | Lethellier | 323/289 |
| 4,645,945 | 2/1987 | de Sartre | 307/300 |

OTHER PUBLICATIONS

Dynamic Transistor Antisaturation Control, K. H. Knickmeyer, IBM Technical Disclosure Bulletin vol. 17, No. 4, Sep. 1974, pp. 1091–1092.
Data sheet, "LM117/LM217/LM317 3-Terminal Adjustable Regulator", National Semiconductor Corporation, 1982.
Application Note AN-110, "Fast IC Power Transistor with Thermal Protection", May 1974, National Semiconductor Corporation.
Data Sheet, "LT1005M/LT1005C Logic Controlled Regulator", Linear Technology Corporation, 1985.
Data sheet, "LT1001 Precision Operational Amplifier", Linear Technology Corporation, 1985.
Preliminary LT 1070, Data sheet, pp. 10–14 to 10–17, Linear Technology Corporation Data book 1986.

Primary Examiner—Patrick R. Salce
Assistant Examiner—Judson H. Jones
Attorney, Agent, or Firm—Laurence S. Rogers

[57] ABSTRACT

An adaptive transistor drive circuit including a multiple-emitter transistor, at least one emitter of which is connected to the drive circuit. When the drive current causes the transistor to saturate, the emitter connected to the drive circuit conducts a portion of the drive current to limit saturation of the transistor. A current source provides drive current which varies as a function of the current conducted by the collector of the transistor so as to maintain the transistor in saturation as the collector current and operating temperature vary.

32 Claims, 5 Drawing Sheets

ADAPTIVE TRANSISTOR DRIVE CIRCUIT

BACKGROUND OF THE INVENTION

This invention relates to a circuit for adaptively adjusting the operating point of a transistor in saturation to maintain the forced current gain of the transistor within a desired range throughout a desired range of load conditions and operating temperatures. More particularly, this invention relates to an adaptive transistor drive circuit for use in association with a transistor switch subject to varying load conditions and operating temperatures.

In many applications, it is desirable to operate a transistor in a saturation condition to improve the efficiency of the transistor. One such application is the use of a transistor as a switch in a switching voltage regulator. An ideal switch is one which is capable of controlling a wide range of switch currents with no power dissipation and with an instantaneous transition from a conducting state to a non-conducting state, and vice versa.

Transistors do no fit this ideal description of a switch, but they most closely approximate an ideal switch when operated in the saturation region during the "on" condition of the switch and in the cut-off region during the "off" condition of the switch. This is because a transistor dissipates power as a function of the collector-emitter voltage ($V_{CE}$) multiplied by the collector current ($I_C$). When a transistor is operated in saturation, voltage $V_{CE}$ is low for a given $I_C$. Therefore, to reduce the power dissipated by a transistor used as a switch, particularly at high collector currents, it is desirable that the transistor be operated in saturation during the "on" condition of the switch.

However, efficiency is reduced if the transistor is driven too deeply into saturation. Efficiency suffers because power is dissipated by the circuit employed to provide drive current to the transistor to drive it into saturation. When a transistor is operating in saturation, the drive current provided to the transistor exceeds the value necessary to produce the collector current $I_C$ which results. The amount of excess drive current increases, and the overall efficiency of the circuit decreases, if the transistor is driven too deep into saturation.

An additional consideration is the time required to turn the switch transistor off. Excess base current will cause long turn-off time which may interfere with circuit operation or may require extensive turn-off current drive circuitry to rapidly turn off the switch transistor.

From the foregoing discussion, it will be evident that to optimize the overall efficiency of a circuit including a transistor switch, both the power dissipated by the drive circuit and the power dissipated by the transistor must be minimized. Typically, minimum power dissipation, and optimum overall efficiency, are achieved when the transistor is operated at a point near the edge of saturation.

The point of optimum overall efficiency of a circuit including a transistor in saturation is dependent on the characteristics of the transistor, the operating temperature, and the load on the transistor, i.e., the collector current. For a predetermined value of collector current and operating temperature, the point of optimum efficiency, defined as the ratio of collector current to base current (the forced current gain) of the saturated transistor, can be determined. The circuit can be designed to provide a predetermined drive current to the switch transistor so that the switch transistor operates during "on" conditions at that optimum point, such that the power dissipated by the drive circuit and the power dissipated by the switch transistor are within desired limits. However, if the load, and therefore the switch collector current, varies, or if the temperature varies, the circuit will no longer operate with optimum efficiency if the base current remains fixed. For instance, if load current increases, but base drive current remains constant, the switch transistor will operate at a less saturated point, or drop out of saturation entirely, thus increasing the power dissipated by the circuit. Alternatively, if load current decreases, the switch transistor will be driven by excess base current deeper in saturation, and wasteful power will be dissipated by the drive circuit. Likewise, the circuit will drift away from a point of optimum efficiency with changes in operating temperature.

In view of the foregoing, it would be desirable to provide an adaptive transistor drive circuit for maintaining the operating point of a conducting transistor within a desired range of a chosen point in saturation throughout a desired range of collector currents and operating temperatures.

It would also be desirable to be able to provide an adaptive transistor drive circuit for maintaining the forced current gain of a saturated transistor within a desired range under conditions of varying collector current and operating temperature.

It would further be desirable to be able to provide an adaptive transistor drive circuit which improves the efficiency of a transistor switch operating under conditions of varying switch current and operating temperature.

It would additionally be desirable to be able to provide an adaptive transistor drive circuit for use in a monolithic integrated circuit voltage regulator, and other integrated circuits, which require an efficient switching function at varying collector currents and operating temperatures.

SUMMARY OF THE INVENTION

It is therefore an object of the invention to provide an adaptive transistor drive circuit which is capable of maintaining the forced current gain of a transistor in saturation within a desired range throughout a desired range of collector currents and operating temperatures.

It is a further object of the invention to provide an adaptive transistor drive circuit for a switch circuit including a transistor which is capable of adjusting the operating point of the transistor during on conditions to maintain the operating point within a desired range of a chosen point in saturation to optimize the efficiency of the switch current throughout a desired range of varying transistor collector currents and operating temperatures.

It is another object of the invention to provide an adaptive transistor drive circuit to maintain the operating point of a transistor within a desired range of a chosen point near the edge of saturation throughout a desired range of collector currents and operating temperatures.

It is yet a further object of the invention to provide an adaptive transistor drive circuit to be employed in an integrated circuit switching voltage regulator which improves the efficiency of the regulator over a desired range of switch currents and operating temperatures.

These and other objects of the present invention are accomplished by an adaptive transistor drive circuit including a switching transistor, circuit means to limit the depth of saturation of the switching transistor, and an adaptive current source which provides to the switch transistor a drive current which varies as a function of the current conducted by the collector of the switch transistor, to maintain the forced current gain of the transistor within a desired range of forced current gain, thereby to maintain the operating point of the transistor within a desired range of a chosen point in saturation.

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout, and in which:

FIG. 8 is a graph showing the relationship of supply current to switch current for a switching regulator embodying the adaptive transistor drive circuitry of FIG. 5, and for a switching regulator which lacks such adaptive transistor drive circuitry.

DETAILED DESCRIPTION OF THE INVENTION

Figure 1:
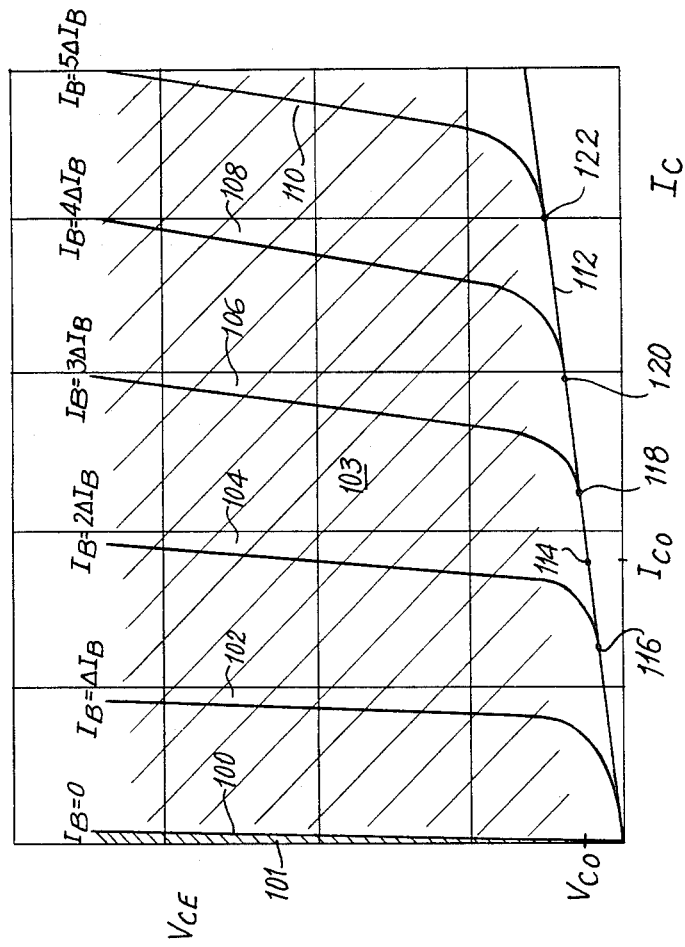
FIG. 1 is a graph showing the output characteristics of a typical silicon bipolar junction transistor for different values of base current.

Referring to FIG. 1, lines 100, 102, 104, 106, 108 and 110 represent output characteristics of a typical silicon bipolar junction transistor as a function of the base current $I_B$. Line 100 corresponds to a base current of zero, and lines 102 through 110 correspond to incremental increases in the base current over zero, $\Delta I_B$, $2\Delta I_B$, etc.

Three operating regions are shown by the graph: the cutoff region, the saturation region and the active region. The shaded area 101 between line 100 and the ordinate of the graph is the cutoff region of operation for the transistor. In cutoff, the collector current is negligible, and the resistance of the collector-emitter circuit, evaluated from the slope of line 100, is high. A transistor operated in the cutoff region approximates the resistance characteristics of an open switch, and the cutoff region is therefore the region in which a transistor employed as a switch is to be operated when the switch circuit is in the off condition.

The saturation region of operation is defined by the saturation line 112 in FIG. 1. The saturation region commences for any particular collector current when the base current $I_B$ multiplied by $h_{FE}$ is equal to $I_{CSAT}$, where $h_{FE}$ is the dc collector-base current gain and $I_{CSAT}$ is the current through the collector. Stated another way, a transistor is in saturation when both its emitter-base and collector-base junctions are forward biased. As can be seen from the graph, voltage $V_{CE}$ is at a minimum for a given value of collector current $I_C$ when the transistor is operated on the saturation line 112. The internal collector-emitter resistance of the transistor operated in saturation, evaluated from the slope of line 112, is low. Thus, a transistor operated in the saturation region approximates the resistance characteristics of a closed switch. Power dissipation in the transistor, due in substantial part to collector-emitter resistance, is minimized for a given collector current by operating the transistor in the saturation region. Therefore, to best approximate the efficiency of an ideal switch, which has zero resistance when closed, a transistor is operated on the saturation line 112 when the switch circuit is in the on condition.

In the active (or linear) region, represented by the shaded central region of graph 103 in which lines 100–110 are relatively uniform in spacing and slope, an increase in base current $I_B$ results in a substantially proportional increase in the collector current $I_C$. The ratio of collector current $I_C$ to base current $I_B$, known as the current gain ($\beta$) of the transistor, for a predetermined operating temperature remains substantially constant when the transistor is operated in the active region.

The current gain of a transistor operating in the saturation region, however, varies with changes in the operating point. The deeper a transistor is driven into saturation, the lower the ratio of collector current $I_C$ to base current $I_B$. The current gain of a transistor in saturation is "forced" lower by the excess base current, and is known as the forced current gain. The point at which the current gain becomes forced, indicating the onset of saturation, varies with the collector current $I_C$. As discussed more fully below, the circuit of the present invention, by adapting the drive current of a switching transistor to the transistor's collector current, ensures that the transistor employed as the switch is operated within a range of forced current gain which is chosen to maintain the transistor within a range of operation in saturation over a desired range of collector load currents such that the efficiency of the switch is optimized. The operating point of the transistor is adjusted by the circuit to that value necessary to maintain the forced current gain within the desired range, and can be substantially any point along line 112 depending on the base and collector currents.

Figure 2:
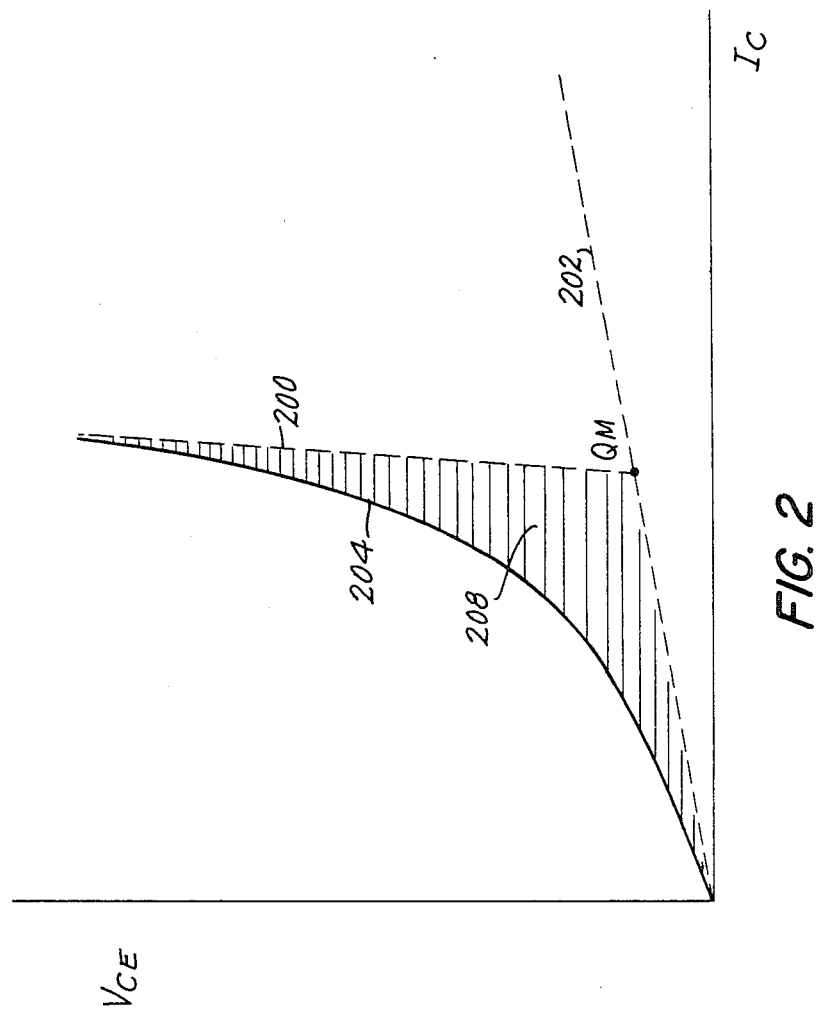
FIG. 2 is a graph showing the output characteristics of a typical silicon bipolar junction transistor for a single value of base current as compared to the output characteristics predicted by a series resistance model of the transistor.

Each of the output characteristic lines 102, 104, 106, 108 and 110 in FIG. 1 can be approximated by two straight lines, one having a slope equal to the series resistance of the transistor collector-emitter circuit during operation in the active region, and the other having a slope equal to the series resistance of the transistor collector-emitter circuit during operation in the saturation region. Such an approximation is known as a series resistance model. A series resistance model of the output characteristics for a typical transistor operating at a given base current is shown in FIG. 2 by dashed lines 200 and 202. Dashed line 200 represents an approximation of transistor operation in the active region. Dashed line 202 represents an approximation of transistor operation in the saturation region. The onset of saturation is approximated by the point Qm at the intersection of dashed lines 200 and 202. The actual characteristics of the transistor are represented by curve 204.

As can be seen from FIG. 2, a circuit designed using a series resistance model to operate a transistor at a point corresponding to the theoretical edge of saturation (Qm) will not drive the actual transistor to the same operating point. At a collector current $I_C$ corresponding to operating point Qm, the actual transistor will operate at a collector-emitter voltage $V_{CE}$ which is higher than that predicted by the series resistance model. The cross-hatched area 208 bounded by the curve 204 and the dashed lines 200 and 202 represents the overall difference in efficiency between the actual transistor and the series resistance model. To overcome the difference in efficiency, the actual circuit must be designed to drive the transistor to an operating point deeper into saturation (towards the origin of the graph) to ensure operation in the saturation region.

Due to the variation in the value of forced current gain at which saturation commences for different switch currents, however, a circuit which is designed to drive a transistor to a particular point of operation in saturation at a particular predetermined collector current may fail to drive the transistor into saturation at higher collector currents, thereby causing the transistor to operate at a less efficient point in the active region. Further, because the saturation point of a transistor also varies with changes in temperature, the same circuit may achieve the desired operating point in saturation only when operated at a particular temperature. Under extreme low temperature conditions, the drive current necessary to drive the transistor into saturation may increase several times over that required at room temperature. For example, at around $-55°$ C. as compared to room temperature (25° C.), the current gain of a Darlington transistor pair typically drops by a factor of four, thereby requiring four times as much base current to drive the cold transistor pair into saturation as is necessary to achieve saturation at room temperature (approximately 25° C.).

Thus, one way to operate a transistor efficiently in saturation throughout a desired range of collector current and temperature is to provide a base current sufficient to drive the transistor into saturation under worst-case conditions of highest collector current and lowest temperature. However, such an approach results in an undesirable increase in the power dissipated by the drive circuit when collector currents are lower and the operating temperature is higher because under such conditions the base current provided to the transistor is in excess of what is necessary to achieve saturation. Referring again to FIG. 1, when a transistor is operating on the saturation line 112, an increase in base current $I_B$ does not result in an increase in collector current $I_C$. For example, a transistor operating in saturation at point 114 has a collector-emitter voltage of $V_{CE_0}$ and a collector current $I_{C_0}$, and a base current of only $2\Delta I_B$ is required to saturate the transistor. An increase in base current $I_B$ equal to $3\Delta I_B$, $4\Delta I_B$, or $5\Delta I_B$, as shown by lines 106, 108 and 110, results in the same collector current, and thus such an increase is unnecessary and wasteful of power.

The excess base current, and the power dissipated by the drive circuit in generating it, can be reduced by designing the circuit to drive the transistor to an operating point just at the edge of saturation, rather than deeply into saturation. Again, however, a circuit which is designed to drive a transistor to a particular point of operation in saturation at a particular collector current and temperature will drive the transistor too deep into oversaturation at lower currents, or not even into saturation at higher currents, thereby wasting power in the drive circuit and the transistor.

The circuit of the present invention overcomes these problems by varying the base current provided to a saturated transistor in response to variations in collector current so that the transistor has a forced current gain within a desired range of forced current gains, to cause the transistor to operate at a point within a desired range of a chosen point in saturation throughout a desired range of collector current and temperature. The chosen point can be deep in saturation or at any other point in saturation. One particularly desirable point is near the edge of saturation, because at that point the overall efficiency of the circuit for a particular collector current is optimized. Points 116, 118, 120 and 122 in FIG. 1 show, for example, operating points for different collector currents and base currents $I_B$ equal to $2\Delta I_B$, $3\Delta I_B$, $4\Delta I_B$ and $5\Delta I_B$, respectively. Although points 116, 118, 120 and 122 are each different operating points, each is within a desired range of a chosen point in saturation, the chosen point being near the edge of saturation for each of the different base and collector currents.

Figure 3:
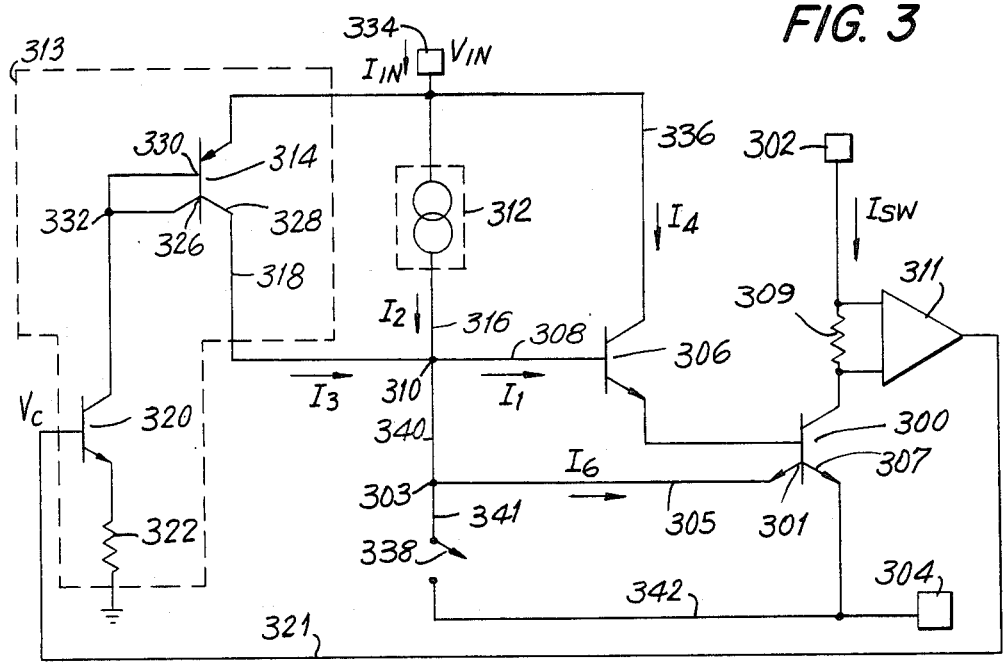
FIG. 3 is a schematic diagram of a switch circuit utilizing the adaptive transistor drive feature of the present invention.

Referring now to FIG. 3, an embodiment of the invention is shown for maintaining the forced current gain of a saturated transistor within a desired range of forced current gains so that the operating point of the transistor is maintained within a desired range of a chosen point near the edge of saturation over a desired range of collector currents and operating temperatures. Transistor 300 is a power switch, controlling the switch current $I_{sw}$ passing between terminals 302 and 304. Current is provided to the base of transistor 300 by transistor 306. Transistor 306 is driven by current $I_1$ provided to its base on path 308. Current source 312 and a collector of transistor 314 are connected and provide current to node 310. Current source 312 generates a current $I_2$ on path 316. Current source 313, including transistors 314 and 320, provides a current $I_3$ on path 318. Transistor 314 generates current $I_3$ out of collector 328 when current is drawn through transistor 320, the collector of which is connected to the base and one collector of transistor 314, and through resistor 322 to ground. Transistor 320 is driven by a voltage $V_c$, which varies as a function of the switch current $I_{sw}$. Voltage $V_c$ is generated by passing the switch current $I_{sw}$ through a resistor 309 and thereafter sensing the voltage across resistor 309 using a conventional voltage sensing differential amplifier 311. The output voltage $V_c$ of amplifier 311 is then applied via line 321 to the base of transistor 320.

The value of current $I_3$ is the product of voltage $V_c$, the voltage-to-current gain of transistor 320 and the current gain of transistor 314. The voltage-to-current gain of transistor 320 is set by the value of resistor 322. The current gain of transistor 314 is determined by the ratio of the areas of collectors 326 and 328 as a result of tying back collector 326 to base 330 at node 332. An area ratio value of six, which means that the area of collector 328 is six times greater than that of collector 326, is typical, although other area ratios also are acceptable and may be used.

Terminal 334 is the input for the power supply voltage $V_{in}$. The supply current $I_{in}$ drawn by the circuit through terminal 334 is, ignoring the base current of transistor 314, the sum of currents $I_2$, $I_3$, and $I_4$, where current $I_4$ is the current provided on path 336 to the collector of transistor 306. The power dissipated by the drive circuit (excluding the power dissipated by transistor 300) is the product of the power supply voltage $V_{in}$ and the supply current $I_{in}$.

During the off condition of the transistor 300, switch 338, connected at one end to nodes 303 and 310 and at the other end to terminal 304, is closed. Switch 338 may be the emitter-collector circuit of a conventional bipolar transistor, or any other device which can be implemented to perform a switching function. Closed switch 338 causes currents $I_2$ and $I_3$ to flow through paths 340, 341 and 342 to terminal 304. As a consequence, current is removed from the base of transistor 306, and transistors 306 and 300 are off.

During the off condition of transistors 306 and 300, current source 312 generates a current $I_2$ which has a value X of sufficient magnitude to turn on transistors 306 and 300 were switch 338 to be opened. At initial start-up of the circuit, voltage $V_c$ is assumed to have a minimal value such that transistor 320 is biased in a non-conducting state. On this assumption, transistor 314 at start-up of the circuit also is off, and current $I_3$ is substantially zero. At start-up, the supply current $I_{in}$ is therefore equal to X, the value of current $I_2$ during the off condition of transistors 306 and 300. (The foregoing assumption of the value of $V_c$ at start-up is for the purpose of illustration, and not of limitation. For example, it can be assumed in the alternative that voltage $V_c$ at start-up is sufficient to cause transistor 320 to conduct so that a non-zero current $I_3$ is added to current $I_2$. In this circumstance, the supply current $I_{in}$ during start-up can be held to the same value X by setting current $I_2$ to a lower value to compensate for the added current $I_3$.)

When switch 338 is first opened, current $I_2$ generated by current source 312 (plus any current $I_3$) is provided to the base of transistor 306, causing both transistors 306 and 300 to turn on. After a short delay (e.g., 50–500 nanoseconds), current $I_2$ is increased to a value $I_2'$, current $I_2'$ being sufficiently high to cause transistor 300 to be driven into saturation by transistor 306 under most (but not extreme) expected conditions of temperature and current through transistor 300. The short delay is caused by an inherent delay in the closing of a switch in current source 312, and reduces excess power dissipation since less current is necessary to turn on transistor 300 when $V_{CE}$ is high (as it is when transistor 300 is off) than is necessary to drive transistor 300 into, and maintain it in, saturation.

The current $I_2'$ produced by current source 312 could be increased to a value which would be capable of driving transistor 300 into saturation even at extremely high currents through transistor 300 and extremely low operating temperatures, but this would waste power in the drive circuit at lower currents and at less extreme temperatures. Moreover, if current $I_2$ is fixed at a high enough level to drive transistor 300 into saturation at the highest expected currents and most extreme temperatures, current $I_{in}$ at lower currents and less extreme temperatures will exceed that necessary to drive transistor 300 into saturation, thereby unnecessarily increasing power dissipation in the drive circuit at such lower currents and less extreme operating temperatures.

The present invention therefore provides another source of drive current $I_3$ which, in conjunction with current $I_2'$ functioning as an offset current, adapts the circuit automatically to variations in collector current through transistor 300 to maintain a saturation condition and to reduce the variation in the forced current gain of transistor 300 at extremes of current and operating temperature. When switch 338 is opened, current $I_2'$ is sufficient to cause transistor 300 to turn-on and to saturate at low to moderate switch currents and non-extreme temperatures. The magnitude of current $I_3$ depends upon the magnitude of voltage $V_c$, which in turn is determined by the magnitude of current $I_{sw}$ as previously described. Current $I_3$ is added at node 310 to increase the current available to transistor 306. At low switch currents and non-extreme operating temperatures where current $I_2'$ is sufficient to drive the switch into saturation, current $I_3$ is low so that only a small amount of excess drive current is generated. At higher currents through transistor 300 and extreme operating temperatures, where current $I_2'$ is insufficient to drive transistor 300 into saturation, current $I_3$ is increased so that the total available drive current ($I_2' + I_3$) is sufficient to ensure that transistor 300 remains in saturation. The functional relationship of current $I_3$ to switch current $I_{sw}$ is determined by the functional relationship of $V_c$ to current $I_{sw}$, and the gains of transistors 320 and 314. The function determining current $I_3$ is chosen for a particular circuit to optimize efficiency of the circuit over the desired range of collector current through transistor 300 and operating temperature, by balancing the power dissipation in transistor 300 and the power dissipation in the drive circuit.

Whereas the above-described circuitry ensures that transistor 300 is operated in saturation throughout a wide range of expected currents and operating temperatures, the present invention also provides means for limiting the extent of oversaturation of transistor 300. This is accomplished in the circuit of FIG. 3 by circuitry including emitter 301 of transistor 300 shown tied back to the base of transistor 306.

Emitter 301 thus prevents transistor 300 from going into saturation substantially beyond a chosen point by providing a path to dispose of drive current which exceeds that necessary to drive transistor 300 to the chosen operating point in saturation. If the base current provided to transistor 300 is such as to drive transistor 300 too deep into saturation, emitter 301 becomes biased such that it functions like a collector, drawing a current $I_6$ along paths 340 and 305 in FIG. 3. This shunts current away from the base of transistor 300, thus limiting the base current to transistor 300 to prevent transistor 300 from being driven too deeply into saturation. The point in saturation at which emitter 301 begins to draw current is determined by the ratio of the areas of emitter 307 and emitter 301. Typically, emitter 307 has an area which is ten or more times greater than that of emitter 301 (although a lesser area ratio may also be used).

Figure 4:
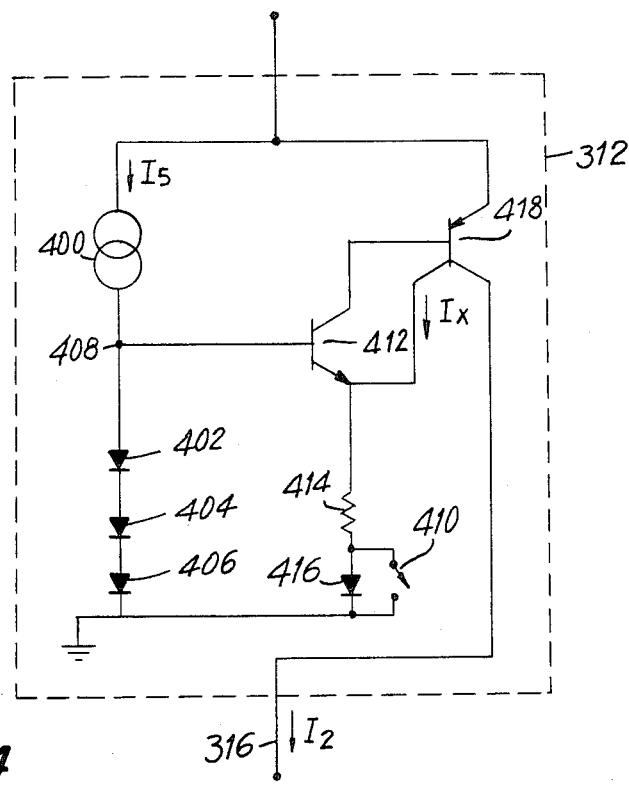
FIG. 4 is a diagram of current source 312 shown in FIG. 3.

FIG. 4 illustrates an exemplary embodiment of a circuit for implementing current source 312 of FIG. 3 which generates current $I_2$ when transistor 300 is off, and current $I_2'$ when transistor 300 is on. As shown in FIG. 4, current source 400 generates in a conventional way a substantially constant current $I_5$. A portion of current $I_5$ flows through series-connected diodes 402, 404 and 406 (which may, for example, be diode-connected transistors), producing a voltage drop between node 408 and ground equal to three times the voltage drop across a forward-biased diode ($V_D$). Switch 410 (which may be the collector-emitter circuit of a transistor) is open when transistor 300 is off, and is closed when transistor 300 is on, except for a period of approximately 50–500 nanoseconds following the opening of switch 338, during which period transistor 300 is driven from a cutoff state to at least the active region of operation. When switch 410 is open, the voltage of 3 $V_D$ at node 408 is dropped across the base-emitter junction of transistor 412, series-connected resistor 414 and series-connected diode 416. The base-emitter junction of transistor 412 has a forward-bias voltage drop of approximately 1 $V_D$. Forward-biased diode 416 also has a voltage drop of 1 $V_D$. As a result, 1 $V_D$ is dropped across resistor 414, thus establishing the current of $I_x$ of transistor 418 (ignoring base currents) at 1 $V_D$ divided by the value of resistor 414. This establishes the value for $I_2$ out of the collector of transistor 418 as determined by the ratio, N, of collector areas of transistor 418. A typical value for N is 1:1, although other values may be used.

When switch 410 is closed and transistor 300 is on, diode 416 is shorted so that 2 $V_D$ now is dropped across resistor 414. The collector current $I_2$ of transistor 418 now is doubled to current $I_2'$. It is to be understood that the ratio of the values of $I_2$ and $I_2'$ represented by FIG. 4 is exemplary, and the invention is not limited thereto.

Figure 5:
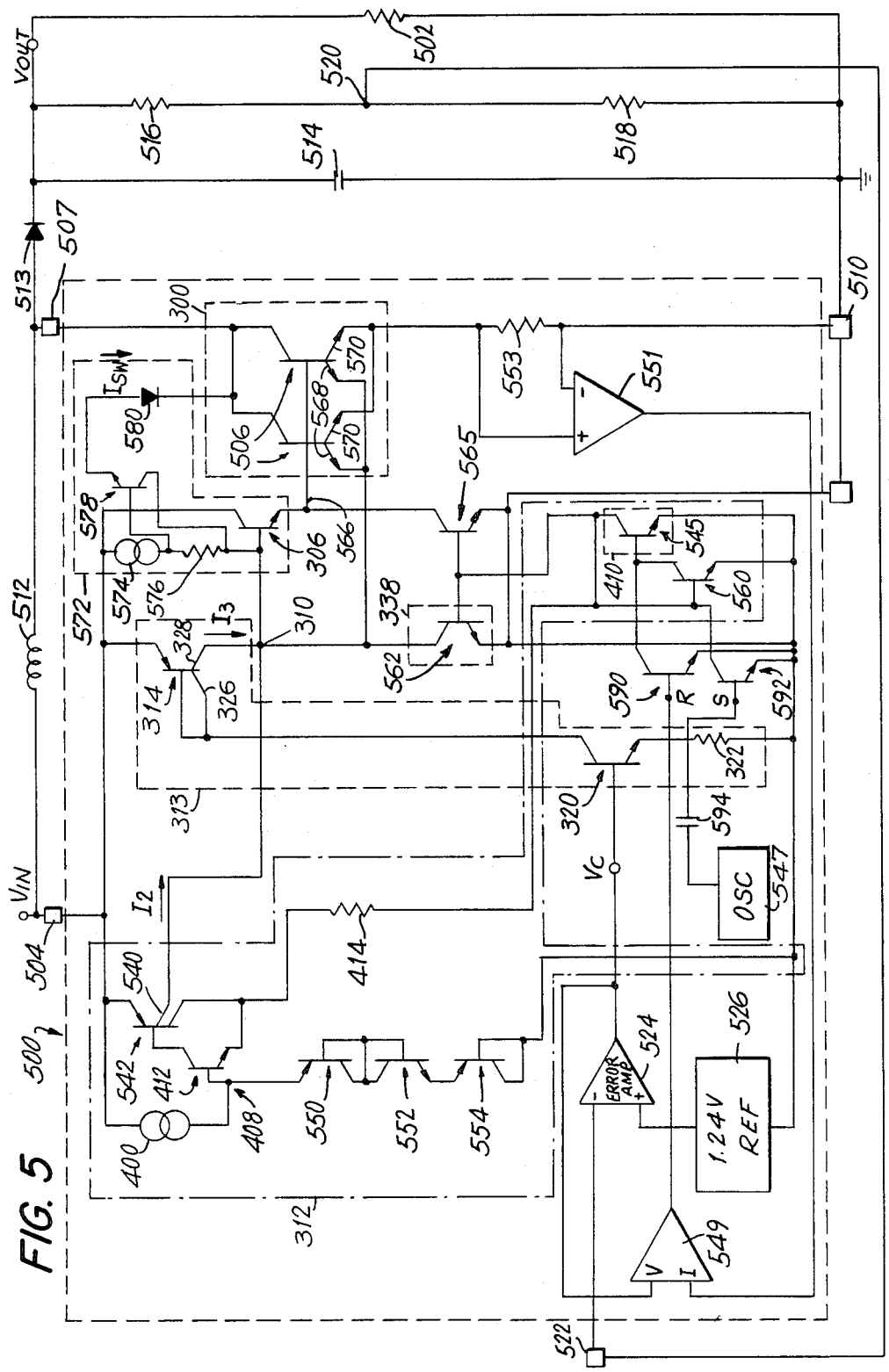
FIG. 5 is a schematic diagram showing an embodiment of the adaptive transistor drive circuit of the present invention in an integrated circuit switching voltage regulator.

FIG. 5 shows an embodiment of an adaptive transistor drive circuit employed in an integrated circuit switching voltage regulator 500. Conventional biasing resistors associated with several of the transistors are not shown except where necessary to facilitate an understanding of the operation and inventive features of the circuit.

As shown in FIG. 5, regulator 500 is configured to provide a substantially constant voltage $V_{out}$ to a load (shown as resistor 502) from an unregulated voltage applied to the pin labelled $V_{in}$, the magnitude of the unregulated voltage being less that of $V_{out}$. The configuration conventionally is known as a boost switching regulator circuit. The collector of switching transistor 300 is connected at pin 507 to one end of an inductor 512, the other end of which is connected to $V_{in}$ at pin 504. The emitter of transistor 300 is connected to ground at terminal 510. When transistor 300 is on, current $I_{sw}$ is drawn from terminal 504 through inductor 512, and energy is stored in the inductor. When transistor 300 is off, energy is transferred from inductor 512 to output storage capacitor 514 and load 502 through steering diode 513. Other well-known switching regulator circuit topologies may be employed to provide values of $V_{out}$ greater than, less than, or of opposite polarity to, $V_{in}$.

The output voltage $V_{out}$ is kept substantially constant by controlling the transfer of energy from $V_{in}$ to load 502. This is accomplished by appropriately altering the duty cycle of transistor 300. Transistor 300 is comprised of a plurality of power transistors 506 connected in parallel (two transistors are shown, although any number may actually be used). The on and off duty cycle of transistor 300 is controlled by a set/reset flip-flop comprised of transistors 545 and 560 and driver transistors 590 and 592 the set input ("S") of which is connected through capacitor 594 to the output of oscillator 547 (which produces a high frequency, e.g., 40 kHz, square wave clock signal), and the reset input ("R") of which is connected to the output of comparator 549. A first input (labelled "V") of comparator 549 is connected to the output of differential error amplifier 524. A second input (labelled "I") of comparator 549 is connected to the output of differential amplifier 551. Differential amplifier 551 is connected to and detects the voltage across resistor 553 generated by current $I_{sw}$ conducted by transistor 300, and provides a voltage proportional to current $I_{sw}$ to the I input of comparator 549. Error amplifier 524, which has a gain of approximately 1000, provides to the V input of comparator 549 a voltage proportional to the difference in voltage between an internal 1.24 V reference voltage established by voltage reference 526 and a voltage proportional to $V_{out}$ established by resistors 516 and 518 connected as a series voltage divider between $V_{out}$ and ground. In the preferred embodiment, resistors 516 and 518 have values of 10.7K ohms and 1.24K ohms, respectively, for an output voltage of 12 volts. The output of error amplifier 524, labelled "$V_c$", is applied to the base of transistor 320 through two conventional buffering transistors (not shown). Resistor 322, connected to the emitter of transistor 320, has a value of approximately 1.7 kilohms.

As described more fully below, the clock signal applied to the set input of the flip-flop comprised of transistors 545, 546, 590 and 592 causes transistor 300 to turn on. Comparator 549 provides an output signal to the reset input of the flip-flop which causes transistor 300 to turn off when current $I_{sw}$ reaches a trip level set by the voltage at the output of error amplifier 524. Thus, the flip-flop functions in a conventional manner to produce a square wave digital output at the collector of transistor 545 the duty cycle of which varies as a function of the voltage and current required by load 502, so as to maintain $V_{out}$ substantially constant.

Throughout the expected range of operating conditions for integrated circuit 500, the output of error amplifier 524 varies between 0.9 volts for the lowest value of current $I_{sw}$ through transistor 300 and 2.0 volts for the highest current. Current $I_{sw}$ varies with respect to the output of error amplifier 524 ($V_c$) at a preferable average rate, K, of approximately eight amps per volt change in $V_c$. Because voltage $V_c$ varies with current $I_{sw}$, the collector current of transistor 320 proportionally varies with current $I_{sw}$. The variation in collector current of transistor 320 causes proportional variation of current $I_3$ because of the connection as shown of transistor 314 to transistor 320. Transistor 314 has a current gain established by the ratio of the area of collector 328 to the area of tied-back collector 326. The ratio of the area of collector 328 to collector 326 in the circuit of FIG. 5 is 7.3:1.3, or approximately 6. The extent to which current $I_3$ increases and decreases with increases and decreases in current $I_{sw}$ may be expressed as $I_{3+}$ $MI_{sw}$, where M is a constant. The value of M must be empirically determined to optimize the efficiency of the circuit. It is calculated by multiplying the value of K by the value of resistor 322, and dividing the product into the gain of transistor 314. For the embodiment of FIG. 5, M is approximately 0.44 mA/Amp, meaning that current $I_3$ increases 0.44 milliamps for every one amp increase in current $I_{sw}$.

Current $I_3$ is supplied by transistor 314 to node 310, where it is added to current $I_2$. Current $I_2$ is provided by collector 540 of transistor 542. Transistor 542 is driven by transistor 412 to generate as described with respect to FIG. 4 either current $I_2$ or twice $I_2$, depending, respectively, on whether switch 410, comprised of flip-flop transistor 545, is off or on. Current source 400 generates in a conventional way a constant current which is sufficient to forward bias diode-connected transistors 550, 552 and 554, resulting in a voltage at node 408 equal to approximately $3V_D$, where $V_D$ is the forward-biased voltage drop of a diode. When transistor 545 is off, resistor 414 (one end of which is connected to the emitter of transistor 412 and a collector of transistor 540, and the other end of which is connected to the base of transistor 560 and the collector of transistor 545) and the forward-biased base emitter junctions of transistors 412 and 560 each drop 1 $V_D$. The current through resistor 414 is thus fixed when transistor 545 is off, which in turn fixes current $I_2$. When transistor 545 is turned on the base of transistor 560 is shorted to ground. As a result, resistor 414 now drops 2 $V_D$, thereby fixing the current passing through the resistor at twice its previous value, which in turn establishes current $I_2$ at a value $I_2'$ equal to twice its previous value.

Flip-flop transistor 545 also controls the on and off condition of transistor 300. When transistor 545 is on, transistor 562 (the base of which is connected to the collector of transistor 545) is off because transistor 545 shorts to ground the base of transistor 562. This causes currents $I_2$ and $I_3$ entering node 310 to flow to the base of and turn on transistor 306, in turn causing current to be provided to the base of transistor 300 turning transistor 300 on. Transistor 565 (the base of which also is connected to the collector of transistor 545) is also turned off by the turn-on of transistor 545. When transistor 545 turns off, transistors 562 and 565 turn on to sink base drive away from transistors 306 and 300 to turn transistor 300 off.

If the base current provided to transistor 300 is in excess of that required to drive transistor 300 to a predetermined depth of saturation for a particular value of collector current $I_{sw}$ being conducted by transistor 300, emitters 568 of transistor 300 draw current from node 310 to limit the base current and prevent oversaturation beyond a chosen point. Transistor 300 operates at a point in saturation determined by the ratio of the combined areas of the tied-back emitters 568 to the combined areas of emitters 570. In the embodiment of FIG. 5, this ratio is approximately 1:28. The operating point, the ratio and hence the allowed depth of saturation are chosen empirically as a function of the expected range of collector currents and operating temperatures to optimize the efficiency of the particular circuit with which the invention is used.

For example, the circuit of FIG. 5 is designed to operate with supply voltages from 3 V to 60 V, over a temperature range of $-55°$ C. to $125°$ C. With zero collector current through transistor 300, the circuit draws a quiescent supply current of approximately 6 mA over this range. The operating point of transistor 300 is set by the ratio of emitter area of transistor 300 and by the values of currents $I_2$ and $I_3$, such that transistor 300 operates in saturation near the edge of saturation over a desired range of collector current from 0 to 9A. The magnitude of offset current $I_2$, and the proportional relationship of current $I_3$ to collector current, are two variables which can be adjusted to tailor the drive current provided to transistor 300 over the desired range of collector currents to any value desired. Likewise, the emitter ratio of transistor 300 is a variable which can be adjusted to maintain a desired depth in saturation. Preferably, these three variables are set to maintain the transistor within a desired range of a chosen point near the edge of saturation over the desired range of collector currents and temperatures to optimize the efficiency of the drive circuit and the transistor.

Figure 6:
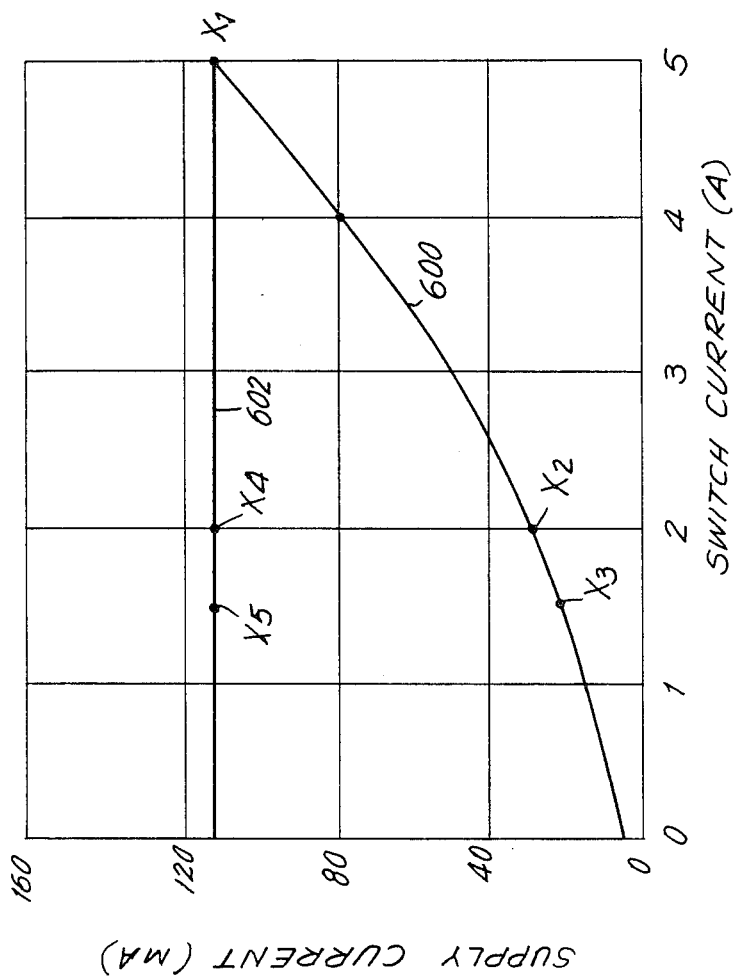

FIG. 6 graphically illustrates the way in which the invention shown in FIG. 5 operates to increase overall efficiency. FIG. 6 is a graph of supply current versus output current through transistor 300 in the switching regulator circuit of FIG. 5 operating at a temperature of approximately 25° C. (curve 600), and in a circuit without the invention (curve 602). Curve 600 shows that the current gain of transistor 300 in saturation at 25° C., measured as the ratio of collector current to supply current (the forced current of gain of transistor 300), remains within a range of about 45–75 over a range of output current of 0–5 A: at point $X_1$, the current gain is approximately 45; at point $X_2$, it is approximately 65; and at point $X_3$ it is approximately 75. The decrease in forced current gain at higher switch currents reflects the fact that the value of forced current gain required to operate transistor 300 at the edge of saturation decreases as the collector current increases. At temperatures lower than 25° C., the slope of curve 600 would be increased, and at higher temperatures, would be decreased, reflecting the fact that the value of current gain necessary to operate transistor 300 at the edge of saturation increases as temperature decreases, and vice versa, and that the effect of temperature increases with increased collector current. Curve 602, on the other hand, shows that the forced current gain of a saturated transistor driven by a circuit which lacks the present invention is more variable over the range of collector currents: at point $X_4$, the forced current gain is about 18; and at point $X_5$, the forced current gain is about 13. Assuming that the forced current gain of 45 at point $X_1$ is sufficient to drive the switch transistor into saturation, in the circuit without the invention large power losses occur at lower switch currents because as collector current through the switch decreases, the forced current gain is undesirably lower and the switch transistor is driven deeper into saturation.

While the invention thus far has been described in the context of a switching transistor using a tied back emitter to limit the depth of saturation, it will be appreciated that other circuit techniques may be utilized in implementing the invention. For example, FIG. 5 shows an alternative technique for implementing the invention utilizing a circuit 572 to sense the depth of saturation and responsively limit the base current provided to transistor 300 to prevent the transistor from operating too deeply in saturation.

Circuit 572 includes current source 574 connected to one end of resistor 576 and to the base of transistor 578, the collector of which is connected to the other end of resistor 576 and to the base of transistor 306. Transistor 578, in conjunction with resistor 576, operates as a diode having a diode voltage drop of about 0.3 volts. The emitter of transistor 578 is connected to the anode of diode 580 (which may be a diode-connected transistor), having a diode voltage drop of about 0.6 volts. As can be seen from FIG. 5, a loop is formed including transistor 578, diode 580, the collector-base junction of transistor 300, and the base-emitter diode junction of transistor 306. When transistor 300 is on, and its base-collector junction is reverse biased (i.e., transistor 300 is in the active region), or forward biased (i.e., transistor 300 is in saturation) at a voltage less than approximately 0.3 volts, transistor 578 and diode 580 are off, and transistor 306 is on. When the base-collector junction of transistor 300 exceeds a forward-bias voltage of about 0.3 volts, as occurs when the transistor is driven deep into saturation, transistor 578 and diode 580 conduct, shunting current away from the base of transistor 306 to limit the forward-bias voltage of the base-collector junction of transistor 300 to a value of approximately 0.3 volts. In this manner, circuit 572 limits the depth of saturation of transistor 300. In an actual embodiment of an integrated circuit utilizing the present invention, circuit 572 is used in conjunction with a circuit including tied-back emitters as shown in FIG. 5 to prevent excessive transistor saturation. Either circuit, however, can be used without the other to limit the depth of saturation.

While preferred embodiments of the invention have been set forth for purposes of the disclosure, modification of the disclosed embodiments may occur to those skilled in the art. For example, while the adaptive anti-saturation feature of the present invention has been disclosed in the context of a switching voltage regulator, it will of course be understood by those skilled in the art that the invention may be employed in any type of circuit utilizing saturated transistors which are subject to varying collector currents or operating temperatures. One such other type of circuit is the output switch of a comparator.

Thus a circuit for adaptively maintaining the operating point of a switching transistor at a chosen point in saturation during on conditions of the switch under varying switch current and operating temperature conditions is provided. One skilled in the art will appreciate that the present invention can be practiced by other than the described embodiments, which are presented for purposes of illustration and not of limitation, and the present invention is limited only by the claims which follow.

What is claimed is:

1. In a circuit including a transistor for connection to a load, the transistor having a plurality of emitters, at least one collector and a base, and operable at a chosen point in saturation defined by a ratio of collector current to base current, a circuit for maintaining the transistor at an operating point within a desired operating range of the chosen point in saturation over a desired range of collector currents and operating temperatures, comprising:
   means for generating a drive signal which is related to at least one of the instantaneous and peak current conducted by the transistor;
   base drive means responsive to said drive signal for variably providing sufficient base current to the transistor to prevent the transistor from operating at a less saturated point outside the desired operating range; and
   means including at least one emitter of the transistor connected to said base drive means for sensing the depth of saturation of the transistor, said emitter being adapted to conduct a current when the transistor reaches a predetermined depth of saturation whereby the current entering the base of the transistor is adjusted to prevent the transistor from operating at a more saturated point outside the desired operating range.

2. The circuit of claim 1, wherein said drive signal generating means comprises:
   a resistor in series with a collector-emitter circuit of the transistor for developing a current sense voltage; and
   means responsive to the current sense voltage for developing a drive signal indicative of the instantaneous magnitude of current conducted by the transistor.

3. The circuit of claim 1 or claim 2, wherein said base drive means comprises:
   a second transistor having a plurality of collectors, each collector having a collector area, at least one collector for providing a current and at least one different collector connected to the base of said second transistor, whereby said second transistor has a current gain defined by a ratio of the area of the collectors providing the current to the area of the collectors connected to the base of said second transistor; and
   a third transistor for amplifying the current provided by said second transistor and for providing the base current to the transistor.

4. The circuit of claim 3, wherein said base drive means further comprises:
   a fourth transistor responsive to the drive signal and connected to said second transistor for controlling the base current provided to the transistor, such that the base current provided by said third transistor respectively increases and decreases as the drive signal increases and decreases.

5. The circuit of claim 1, further comprising:
   means for providing to the transistor an offset base current sufficient to maintain the transistor in saturation at an operating point within the desired range of the chosen point in saturation over a portion of the desired range of collector currents and operating temperatures.

6. The circuit of claim 1, wherein the chosen point in saturation is near the edge of saturation of the transistor, and wherein said base drive means prevents the transistor from dropping out of saturation at the highest collector current and lowest operating temperature within the desired range of collector currents and operating temperatures.

7. The circuit of claim 1, wherein said base drive means respectively increases and decreases base current provided to the transistor as collector current of the transistor increases and decreases.

8. The circuit of claim 1, wherein:
   said at least one emitter shunts at least a portion of the base current provided to the transistor when the transistor reaches a predetermined depth of saturation, thereby limiting the magnitude of current entering the base of the transistor.

9. The circuit of claim 1, wherein said saturation sensing means further comprises:
   means connected to the base and a collector of the transistor for sensing the base-collector forward voltage drop of the transistor, and for conducting at least a portion of the current provided to the base of the transistor when the base-collector forward voltage drop of the transistor reaches a predetermined value.

10. The circuit of claim 9, wherein said means connected to the base and collector of the transistor comprises:
    first means to develop a first diode-junction voltage;
    second means to develop a second diode-junction voltage greater than the first diode-junction voltage; and
    means for connecting said first means, said second means and the base-collector circuit of the transistor serially in a loop, wherein the first diode-junction voltage is in phase opposition to the base-collector forward voltage when the transistor is in saturation, and in phase with the second diode-junction voltage.

11. In a circuit including a transistor for connection to a load, the transistor having a plurality of emitters, at least one collector and a base, and operable in saturation such that the transistor has a forced current gain, a circuit for maintaining the forced current gain of the transistor within a desired range between a maximum and a minimum forced current again over a desired range of collector currents and operating temperatures, comprising:

means for generating a drive signal which is related to the current conducted by the transistor; and base drive means responsive at least in part to said generating means for varying the magnitude of base current provided to the transistor to prevent the forced current gain of the transistor from exceeding the desired maximum forced current gain; wherein at least one emitter of the transistor is connected to said base drive means, said emitter being adapted to conduct a current when the transistor reaches a predetermined depth of saturation for limiting the amount of current entering the base of the transistor to prevent the forced current gain of the transistor from being less than the desired minimum forced current gain.

12. The circuit of claim 11, wherein said drive signal generating means comprises:

a resistor in series with a collector-emitter circuit of the transistor for developing a current sense voltage; and means responsive to the current sense voltage for developing a drive signal indicative of the instantaneous magnitude of current conducted by the transistor.

13. The circuit of claim 11 or claim 12, wherein said base drive means comprises:

a second transistor having at least one collector for providing a current; and a third transistor for amplifying the current provided by said second transistor and for providing the base current to the transistor.

14. The circuit of claim 13, wherein said base drive means further comprises:

a fourth transistor responsive to the drive signal and connected to said second transistor, such that the base current provided by said third transistor respectively increases and decreases as the drive signal increases and decreases.

15. The circuit of claim 11, further comprising:

means for providing to the transistor an offset base current sufficient to maintain the forced current gain of the transistor within the desired range of forced current gains over a portion of the desired range of collector currents and operating temperatures.

16. The circuit of claim 11, wherein the range of forced current gains is chosen to maintain the operating point of the transistor near the edge of saturation, and wherein said base drive means prevents the transistor from dropping out of saturation at the highest collector current and lowest operating temperature within the desired range of collector currents and operating temperatures.

17. The circuit of claim 11, wherein said base drive means respectively increases and decreases base current provided to the transistor as collector current of the transistor increases and decreases.

18. The circuit of claim 11, wherein:

said at least one emitter shunts at least a portion of the base current provided to the transistor when the transistor reaches a predetermined depth of saturation, thereby limiting the magnitude of current entering the base of the transistor.

19. The circuit of claim 11, wherein said saturation sensing means further comprises:

means connected to the base and collector of the transistor for sensing the base-collector forward voltage drop of the transistor, and for conducting at least a portion of the current provided to the base of the transistor when the base-collector forward voltage drop of the transistor reaches a predetermined value.

20. The circuit of claim 19, wherein said means connected to the base and collector of the transistor comprises:

first means to develop a first diode-junction voltage;

second means to develop a second diode-junction voltage greater than the first diode voltage; and means for connecting said first means, said second means and the base-collector circuit of the transistor serially in a loop, wherein the first diode-junction voltage is in phase opposition to the base-collector forward voltage when the transistor is in saturation, and in phase with the second diode-junction voltage.

21. In a circuit including a transistor for connection to a load, the transistor having at least one collector, at least two emitters and a base, and operable at a chosen point in saturation defined by a ratio of collector current to base current, a circuit comprising:

means for providing sufficient base current to the transistor to drive the transistor into saturation; and at least one emitter of the transistor connected to said base current providing means, said emitter being adapted for conducting a current to adjust the amount of base current entering the base of the transistor to limit the depth of saturation of the transistor.

22. In a switching regulator circuit including a switching transistor having at least one collector, at least one emitter and a base, the switching transistor operable at a chosen point in saturation defined by a ratio of collector current to base current, and further operable over a desired range of collector currents and operating temperatures, a drive circuit comprising:

means for generating a first base current sufficient to drive the switching transistor to an operating point within the desired range of the chosen point of operation throughout a portion of the desired range of collector currents and operating temperatures;

means for variably generating a second base current; and means for combining and providing to the switching transistor the first and second base currents; wherein the first and second base currents maintain the switching transistor at an operating point in saturation within a desired range of the chosen point in saturation throughout the desired range of collector currents and operating temperatures.

23. The circuit of claim 2, wherein said current sense voltage developing means comprises a resistor connected to one of an emitter and a collector of the transistor.

24. The circuit of claim 12, wherein said current sense voltage developing means comprises a resistor connected to one of an emitter and a collector of the transistor.

25. The circuit of claim 4, further comprising:

a fifth transistor connected for causing an offset base current to be provided to the transistor sufficient to maintain the transistor in saturation at an operating point within the desired range of the chosen point in saturation over a portion of the desired range of collector currents and operating temperatures.

26. The circuit of claim 21, wherein said emitter shunts away from the base of the transistor at least a portion of the base current provided to the transistor when the transistor reaches said predetermined depth of saturation.

27. The circuit of claim 22, wherein the switching transistor includes a plurality of emitters at least one of which is adapted for conducting a current to adjust at least one of the first and second base currents entering the base of the switching transistor, so as to avoid operation of the switching transistor substantially beyond a desired point in saturation.

28. The circuit of claim 10, further including a driver transistor connected to provide base current to the transistor, and wherein:
said means for connecting includes the base-emitter circuit of said driver transistor.

29. The circuit of claim 1, wherein said drive signal generating means comprises:
means for sensing at least a portion of the voltage across the load;
means for limiting the magnitude of peak current conducted by the transistor as a function of the magnitude of the sensed load voltage; and
means responsive to said load voltage sensing means for producing the drive signal, whereby the magnitude of the drive signal is determined at least in part by the magnitude of the sensed load voltage.

30. The circuit of claim 29, wherein said load voltage sensing means is a voltage divider, and said drive signal producing means comprises:

a reference voltage source for producing a reference voltage; and
an error amplifier for receiving as inputs the reference voltage and the sensed load voltage, and for producing the drive signal as an output voltage indicative of the difference between the reference and load voltages.

31. The circuit of claim 20, further including a drive transistor connected to provide base current to the transistor, and wherein:
said means for connecting includes the base-emitter circuit of said driver transistor.

32. A circuit for limiting the depth of saturation of a transistor, the transistor having a base, at least one collector and at least one emitter, comprising:
a base drive transistor for providing base current to the transistor sufficient to drive the transistor into saturation, the base drive transistor having a base, at least one collector and at least one emitter;
a first diode-junction for producing a first diode voltage; and
a second diode-junction for producing a second diode voltage; wherein
said first and second diode-junctions, a base-emitter circuit of said base drive transistor, and a base-collector circuit of the transistor are connected serially in a loop such that said first and second diode-junctions are in phase with one another, in phase opposition to the base-emitter junction of the driver transistor, and in phase opposition to the forward voltage drop of the base-collector circuit of the transistor when the transistor is in saturation;
whereby the first and second diode-junctions conduct a current when the base-collector forward voltage of the transistor reaches a predetermined value to limit the amount of current entering the base of the transistor such that the transistor is prevented from operating substantially beyond a chosen point in saturation.

* * * * *

REEXAMINATION CERTIFICATE (1465th)

United States Patent [19]

Nelson

[11] B1 4,755,741

[45] Certificate Issued May 14, 1991

[54] ADAPTIVE TRANSISTOR DRIVE CIRCUIT

[75] Inventor: Carl T. Nelson, San Jose, Calif.

[73] Assignee: Linear Technology Corporation

Reexamination Request:
No. 90/002,035, Jun. 1, 1990

Reexamination Certificate for:
Patent No.: 4,755,741
Issued: Jul. 5, 1988
Appl. No.: 932,014
Filed: Nov. 18, 1986

[51] Int. Cl.$^5$ .................................................. G05F 1/44
[52] U.S. Cl. .................................... 323/289; 323/285; 307/296.6; 330/296
[58] Field of Search ............... 323/222, 282, 284, 285, 323/289; 307/296.1, 296.6; 330/267, 296

[56] References Cited

U.S. PATENT DOCUMENTS

| | | | |
|---|---|---|---|
| 3,105,158 | 9/1963 | Nichols | 307/88.5 |
| 3,534,281 | 10/1970 | Hillhouse . | |
| 3,569,742 | 3/1971 | Schroeder | 307/254 |
| 3,641,369 | 2/1972 | Wallingford | 307/260 |
| 3,845,405 | 10/1974 | Leidich | 330/207 P |
| 4,028,561 | 7/1977 | Black et al. | 307/299 A |
| 4,031,416 | 6/1977 | Peil | 307/300 |
| 4,164,747 | 8/1979 | Gerstner | 357/46 |
| 4,426,590 | 1/1984 | Rischmuller | 307/255 |
| 4,461,960 | 7/1984 | Yasunaga | 307/243 |
| 4,542,399 | 9/1985 | Monticelli | 357/46 |
| 4,727,264 | 2/1988 | Neidorff | 307/125 |

OTHER PUBLICATIONS

Collector Diffusion Isolation-A New Bipolar Process For Integrated Circuits, 2nd Edition, Oct. 1972.
Vol. III of the Proceedings of Powercon 3: Third National Solid State Power Conversion Conference, Jun., 1976.
Data Sheet, "LM101A/LM301A, LM107/LM307 Operational Amplifiers", Linear Technology Corporation Linear Databook 1986.
Data Sheet, "LM119/LM219/LM319 High Speed Dual Comparator", National Semiconductor Corporation Linear Databook 1982.
Data Sheet, "LM111/LM211 Voltage Comparator", National Semiconductor Corporation Linear Databook 1982.
Dobkin, "Monolithic Temperature Transducer", Feb. 1974, IEEE International Solid-State Circuits Conference Digest of Technical Papers, p. 126.

Primary Examiner—William H. Beha, Jr.

[57] ABSTRACT

An adaptive transistor drive circuit including a multiple-emitter transistor, at least one emitter of which is connected to the drive circuit. When the drive current causes the transistor to saturate, the emitter connected to the drive circuit conducts a portion of the drive current to limit saturation of the transistor. A current source provides drive current which varies as a function of the current conducted by the collector of the transistor so as to maintain the transistor in saturation as the collector current and operating temperature vary.

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 1-20, 22-25 and 27-31 is confirmed.

Claims 21 and 32 are determined to be patentable as amended.

Claim 26, dependent on an amended claim, is determined to be patentable.

* * * * *

REEXAMINATION CERTIFICATE (2754th)
United States Patent [19]
Nelson

[11] B2 4,755,741
[45] Certificate Issued Dec. 26, 1995

[54] ADAPTIVE TRANSISTOR DRIVE CIRCUIT

[75] Inventor: Carl T. Nelson, San Jose, Calif.

[73] Assignee: Linear Technology Corporation, Milpitas, Calif.

Reexamination Requests:
No. 90/003,419, Apr. 28, 1994
No. 90/003,561, Sep. 9, 1994

Reexamination Certificate for:
Patent No.: 4,755,741
Issued: Jul. 5, 1988
Appl. No.: 932,014
Filed: Nov. 18, 1986

Reexamination Certificate B0 4,755,741 issued May 14, 1991

[51] Int. Cl.$^6$ ............................................. G05F 1/44
[52] U.S. Cl. ........................... 323/289; 323/285; 307/97; 330/296
[58] Field of Search ................... 323/222, 282, 323/284, 285, 289; 307/96, 97, 100; 330/296, 297

[56] References Cited

U.S. PATENT DOCUMENTS

| | | | |
|---|---|---|---|
| 3,617,845 | 11/1971 | McKenna | 318/341 |
| 3,996,506 | 12/1976 | Kichak | 321/13 |
| 4,027,228 | 5/1977 | Collins | 323/21 |
| 4,074,147 | 2/1978 | Infante | 307/230 |
| 4,156,837 | 5/1979 | Baker | 323/4 |
| 4,176,309 | 11/1979 | Schulz et al. | 318/772 |
| 4,213,068 | 7/1980 | Ahmed | 307/255 |
| 4,215,279 | 7/1980 | Lataire et al. | 307/254 |
| 4,218,730 | 8/1980 | Marumoto et al. | 363/124 |
| 4,220,873 | 9/1980 | Giordano | 307/254 |
| 4,234,805 | 11/1980 | Carlsen, II | 307/254 |
| 4,254,372 | 3/1981 | Moore, Jr. | 323/277 |
| 4,286,175 | 8/1981 | Baker | 307/581 |
| 4,291,259 | 9/1981 | Marumoto et al. | 318/139 |
| 4,300,081 | 11/1981 | Van Landingham | 318/599 |
| 4,309,645 | 1/1982 | DeVilleneuve | 318/341 |
| 4,323,825 | 4/1982 | Hayes | 315/387 |
| 4,333,120 | 6/1982 | Kotowski | 361/79 |
| 4,337,494 | 6/1982 | Huykman | 361/86 |
| 4,345,164 | 8/1982 | Gies | 307/255 |
| 4,346,312 | 8/1982 | Christopherson | 307/270 |
| 4,355,277 | 10/1982 | Davis et al. | 323/351 |
| 4,375,073 | 2/1983 | Glogolija et al. | 361/91 |
| 4,378,580 | 3/1983 | Stich | 361/91 |
| 4,427,902 | 1/1984 | Hickman et al. | 307/270 |
| 4,430,608 | 2/1984 | Nelser | 323/282 |
| 4,441,068 | 4/1984 | Smith | 323/351 |
| 4,442,411 | 4/1984 | Gehring | 330/296 |
| 4,461,979 | 7/1984 | Jeenicke et al. | 307/300 X |
| 4,480,201 | 10/1984 | Jaeschke | 307/570 |
| 4,491,744 | 1/1985 | Corey | 307/270 |
| 4,520,438 | 5/1985 | Norton | 363/98 |
| 4,528,463 | 7/1985 | Kung | 307/270 |
| 4,533,839 | 8/1985 | Balakrishnan | 307/270 |

(List continued on next page.)

FOREIGN PATENT DOCUMENTS 0159233  3/1985  European Pat. Off. .

OTHER PUBLICATIONS

IBM Technical Disclosure Bulletin, vol. 21, No. 8, Jan. 1979.

Optimizing Dynamic Behavior With Input and Output Feed-Forward and Current-Mode Control, By Redl *Proceedings of Powercon 7*, Mar. 25–27, 1980.

(List continued on next page.)

*Primary Examiner*—Steven L. Stephan

[57] ABSTRACT

An adaptive transistor drive circuit including a multiple-emitter transistor, at least one emitter of which is connected to the drive circuit. When the drive current causes the transistor to saturate, the emitter connected to the drive circuit conducts a portion of the drive current to limit saturation of the transistor. A current source provides drive current which varies as a function of the current conducted by the collector of the transistor so as to maintain the transistor in saturation as the collector current and operating temperature vary.

U.S. PATENT DOCUMENTS

| | | | |
|---|---|---|---|
| 4,549,095 | 10/1985 | Stefani et al. | 307/254 |
| 4,564,769 | 1/1986 | Melamed | 307/300 |
| 4,588,906 | 5/1986 | Taylor | 307/270 |
| 4,608,524 | 8/1986 | Yokobori | 318/254 |
| 4,645,945 | 2/1987 | de Sartre | 307/254 |
| 4,645,945 | 2/1987 | de Sartre | 307/254 |
| 4,645,986 | 2/1987 | Melbert et al. | 315/387 |
| 4,695,915 | 9/1987 | Mahalek et al. | 361/56 |
| 4,727,264 | 2/1988 | Neidorff | 307/125 |
| 4,749,876 | 6/1988 | Gale et al. | 307/270 |
| 4,777,386 | 10/1988 | Majumdar | 307/270 |

OTHER PUBLICATIONS

K. H. Knickmeyer "Dynamic Transistor Antisaturation Control", IBM Technical Disclosure Bulletin, vol. 17, No. 4, Sep. 1974.

David B. Bell, "Designing Optimal Base Drive for High Voltage Switching Transistors", Proceedings of Powercon 7, 1980.

Ralph Carpenter, "A New Universal Proportional Drive Technique for High Voltage Switching Transistors", Proceedings of Powercon 8, Power Concepts, Inc. 1981.

Joseph Perkinson and Jerry Brand, "A New Proportional Base Drive Technique Optimizes Turnoff Performance", Proceedings of Powercon 10, Power Concepts, Inc., 1983.

R. L. Avant, G. E. West, D. J. Shortt and R. E. Palma, "A Proportional Drive for Discontinuous Mode DC-to-DC Converters", IEEE, 1984.

Alan B. Grebene, "Bipolar and MOS Analog Integrated Circuit Design", published by John Wiley & Sons 1984.

Ferranti, "Collector Diffusion Isolation—A New Bipolar Process for Integrated Circuits, 2nd Edition", Ferranti Ltd. 1982.

Bob Mammano, "Simplying Converter Design with a New Integrated Regulating Pulse Width Modulator", Proceedings of Powercon 3, Power Concepts, Inc. 1976.

A. Pressman, "Switching and Linear Power Supply", Power Converter Design 1977, Hayden Book Co. Inc. 1977.

K. Rischmueller, "An Improved Base Drive Method Eliminates Switching Aid Network in Transistorized High Power Convertor Circuits", Proceedings of Powercon 8, Power Concepts, Inc. 1981.

Warren Schultz, "Baker Clamps Traditional Concepts Updated for Third Generation Power Transistors", Reprinted with permission of Power Conversion International, Jul./Aug. 1984.

Linear Technology LT1001 operational amplifier, 1985.

Barney Holland, "A New Integrated Circuit For Current Mode Control", Proceedings of Powercon 10, Power Concepts, Inc., 1983.

Wally E. Rippel, "A New Closed Loop Adaptive Base Drive Scheme Minimizes Transistor Drive and Saturation Losses", Proceedings of Powercon 11, Power Concepts, Inc. 1984.

Berger, H. H. and Wiedmann, S. K., Jul. 1977, "Speed Enhancement of Saturated Transistors", *IBM Technical Disclosure Bulletin*, vol. 20, No. 2, Jul., 1977, pp. 636–637.

Bonkowski, Richard L., "A Technique for Increasing Power Transistor Switching Frequency", *IEEE Transactions on Industry Applications*, vol. IA–22, No. 2, Mar./Apr. 1986, pp. 240–243.

Bonkowski, R. L., "A Technique for Increasing Power Transistor Switching Frequency", published by IEEE, Feb., 1984, pp. 735–738.

Dobkin, Robert C., "IC with Load Protection Simulates Power Transistor", *Electronics*, Feb. 7, 1974 pp. 119–123, month unknown.

Dobkin, Robert, "Variable Output Three Terminal Regulator", *New Electronics*, Jul. 11, 1978, pp. 36 and 39.

Dobkin, Robert C., "Break Loose from Fixed IC Regulators. With Adjustable Three–Terminal Power Monolithics you get Top Performance along with Versatility", *Electronic Design*, vol. 25, No. 8, Apr. 12, 1977, pp. 118–122.

Frederiksen, Thomas M., *Intuitive IC Electronics. A Sophisticated Primer for Engineers and Technicians*, 1982, pp. 78–81, month unknown.

Gersbach, G. E., "Saturation Control Circuit", *IBM Technical Disclosure Bulletin*, vol. 21, No. 8, Jan., 1979, p. 3109.

Horowitz, Paul and Hill, Winfield, "Transistor Saturation", *The Art of Electronics*, Cambridge University Press, 1993, pp. 1062–1063, month unknown.

Nelson, Carl T., "Technological Advances in Monolithic Instrumentation Amplifier and Voltage Regulators", *WESCON Conference Record*, vol. 25, 1981, paper 19/2, 4 pages, month unknown.

Nelson, Carl T., "Power Distribution and Regulation can be Simple, Cheap and Rugged. Self–contained 3–pin regulators are versatile building blocks that simplify many power distribution problems. Here are some useful applications", *Electronic Design News*, Feb. 20, 1973, pp. 52–58.

Nelson, Carl, "New Process Boosts Current Levels of Monolithic Voltage Regulator. Bipolar IC borrows power npn structure from discrete technology to handle currents of 10 A plus", *Electronics*, Jun. 30, 1981, pp. 111–114.

Redl, Richard, and Sokai, Nathan O., "Optimizing Dynamic Behavior with Input and Output Feed–Forward and Current–Mode Control", *Proceedings of Powercon 7*, 1980, pp. H1-1–H1-16, month unknown.

Rischmueller, K., "Lo Power. Auto–Regulated and Auto–Protected Drives for Power Switching", *Power Conversion International*, Sep./Oct., 1979, pp. 22–28.

Schultz, Warren, "Baker Clamps. Traditional Concepts Updated for Third Generation Power Transistors", *Power Conversion International*, Jul./Aug., 1984, pp. 40–45.

Upadhyay, Anand K., and Messenger, Lawrence W., "Base Drive for High Power/Frequency PWM Transistor Inverter", *IEEE*, Sep., 1985, pp. 1020–1024.

"Designing Switching Regulators", Application Note dated Mar. 1969, published by National Semiconductor in *Linear Applications Handbook*, pp. AN2–1 to AN2–12.

B2 4,755,741

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1, 9, 11, 19, 21, 22, 27 and 32 are determined to be patentable as amended.

Claims 2–8, 10, 12–18, 20, 23–26 and 28–31, dependent on an amended claim, are determined to be patentable.

New claims 33–52 are added and determined to be patentable.

1. In a circuit including a transistor for connection to a load, the transistor having a plurality of emitters, at least one collector and a base, and operable at a chosen point in saturation defined by a ratio of collector current to base current, a circuit for maintaining the transistor at an operating point within a desired operating range of the chosen point in saturation over a desired range of collector currents and operating temperatures, comprising:

means for generating a drive signal which is related to at least one of the instantaneous and peak current conducted by the transistor;

base drive means responsive to said drive signal for variably providing sufficient base current to the transistor to prevent the transistor from operating at a less saturated point outside the the desired operating range, *the base drive means including an amplifier circuit having an input for receiving an input signal responsive at least in part to said drive signal and an output for providing the base current to the transistor;* and means including at least one emitter of the transistor connected to said base drive means for sensing the depth of saturation of the transistor, said emitter being being adapted to conduct a current when the transistor reaches a predetermined depth of saturation, *said conduction of current by said emitter causing a decrease in said input signal,* whereby the current entering the base of the transistor is adjusted to prevent the transistor from operating at a more saturated point outside the desired operating range *and efficiency of operation of said base drive means is increased.*

9. [The circuit of claim 1,] *In a circuit including a transistor for connection to a load, the transistor having a plurality of emitters, at least one collector and a base, and operable at a chosen point in saturation defined by a ratio of collector current to base current, a circuit for maintaining the transistor at an operating point within a desired operating range of the chosen point in saturation over a desired range of collector currents and operating temperatures, comprising:*

*means for generating a drive signal which is related to at least one of the instantaneous and peak current conducted by the transistor;*

*base drive means responsive to said drive signal for variably providing sufficient base current to the transistor to prevent the transistor from operating at a less saturated point outside the desired operating range, the base drive means including an amplifier circuit having an input and an output for providing the base current to the transistor; and*

*means including at least one emitter of the transistor connected to said base drive means for sensing the depth of saturation of the transistor, said emitter being adapted to conduct a current when the transistor reaches a predetermined depth of saturation whereby the current entering the base of the transistor is adjusted to prevent the transistor from operating at a more saturated point outside the desired operating range,* wherein said saturation sensing means further comprises:

means connected to the base and a collector of the transistor for sensing the base-collector forward voltage drop of the transistor, and for conducting at least a portion of the current provided to the base of the transistor when the base-collector forward voltage drop of the transistor reaches a predetermined value.

11. In a circuit including a transistor for connection to a load, the transistor having a plurality of emitters, at least one collector and a base, and operable in in saturation such that the transistor has a forced current gain, a circuit for maintaining the the forced current gain of the transistor within a desired range between a maximum and and a minimum forced current again over a desired range of of collector currents and operating temperatures, comprising:

means for generating a drive signal which is related to the current conducted by the transistor; and base drive means responsive at least in part yto said generating means for varying the magnitude of base current provided to the transistor to prevent the forced current gain of the transistor from exceeding the the desired maximum forced current gain, *the base drive means including an amplifier circuit having an input for receiving an input signal responsive at least in part to said drive signal and an output for providing the base current to the transistor;* wherein at least one emitter of the transistor is connected to said base drive, said emitter being being adapted to conduct a current when the transistor reaches a predetermined depth of saturation, *said conduction of current by said emitter causing a decrease in said input signal,* for limiting the amount of current entering the base of the transistor to prevent the forced current gain of the transistor from being less than the desired minimum forced current gain *and increasing efficiency of operation of said base drive means.*

19. [The circuit of claim 11,] *In a circuit including a transistor for connection to a load, the transistor having a plurality of emitters, at least one collector and a base, and operable in saturation such that the transistor has a forced current gain, a circuit for maintaining the forced current gain of the transistor within a desired range between a maximum and a minimum forced current again over a desired range of collector currents and operating temperatures, comprising:*

*means for generating a drive signal which is related to the current conducted by the transistor; and*

*base drive means responsive at least in part to said generating means for varying the magnitude of base current provided to the transistor to prevent the forced current gain of the transistor from exceeding the desired maximum forced current gain; wherein*

*at least one emitter of the transistor is connected to said base drive means, said emitter being adapted to conduct a current when the transistor reaches a predeter-* mined depth of saturation for limiting the amount of current entering the base of the transistor to prevent the forced current gain of the transistor from being less than the desired minimum forced current gain, and wherein said saturation sensing means further comprises:

means connected to the base and collector of the transistor for sensing the base-collector forward voltage drop of the transistor, and for conducting at least a portion of the current provided to the base of the transistor when the base-collector forward voltage drop of the transistor reaches a predetermined value.

21. In a circuit including a transistor for connection to a load, the transistor having at least one collector, at least two emitters and a base, and operable within a desired range of a chosen point in saturation defined by a ratio of collector current to base current, a circuit comprising:

means for receiving a drive signal related to the current conducted by the transistor and for responsively providing a variable base current to the transistor to prevent the transistor from operating at a less saturated point outside of the desired operating range, *said means including an amplifier circuit having an input for receiving an input signal responsive at least in part to said drive signal and an output for providing the base current to the transistor*; and at least one emitter of the transistor connected to said base current providing means, said emitter being adapted for conducting a current *to cause a decrease in said input signal so as* to adjust the amount of base current entering the base of the transistor to limit the depth of saturation of the transistor *and to increase efficiency of operation of the base current providing means*.

22. In a switching regulator circuit including a switching transistor having at least one collector, at least one emitter and a base, the switching transistor operable at a chosen point in saturation defined by a ratio of collector current to base current, and further operable over a desired range of collector currents and operating temperatures, a drive circuit comprising:

means for generating a first base current sufficient to drive the switching transistor to an operating point within the desired range of the chosen point of operation throughtout a portion of the desired range of collector currents and operating temperatures;

means for variably generating a second base current the magnitude of which is related to a current conducted by the switching transistor;

means for combining and providing to the switching transistor the first and second base currents, *said means for combining and providing including an amplifier circuit the output of which is coupled to the base of the switching transistor*; and circuitry for adjusting at least one of the first and second base currents to limit the depth of saturation of the switching transistor, *said adjusting circuitry providing feedback to an input of the amplifier circuit to increase efficiency of operation of the drive circuit*;

wherein the first and second base currents maintain the switching transistor at an operating point in saturatin within a desired range of the chosen point in saturation throughout the desired range of collector currents and operating temperatures.

27. The circuit of claim 22, wherein the switching transistor includes a plurality of emitters *and wherein said circuitry for adjusting comprises* at least one of [which is] said emitters adapted for conducting a current to adjust at least one of the first and second base currents entering the base of the switching transistor, so as to avoid operation of the switching transistor substantially beyond a desired point in saturation.

32. A circuit for operating a transistor within a desired range of a chosen point in saturation, the transistor having a base, at least one collector and at least one emitter, comprising:

a base drive transistor for providing base current to the transistor to drive the transistor into saturation, the base drive transistor having a base, at least one collector and at least one emitter;

a first diode-junction for producing a first diode voltage; and a second diode-junction for producing a second diode voltage; wherein said first and second diode-junctions, a base-emitter circuit of said base drive transistor, and a base-collector circuit of the transistor are connected serially in a loop such that said first and second diode-junctions are in phase with one another, in phase opposition to the base-emitter junction of the driver transistor, and in phase opposition to the forward voltage drop of the base-collector circuit of the transistor when the transistor is in saturation;

whereby the first and second diode-junctions conduct a current when the base-collector forward voltage of the transistor reaches a predetermined value, *said conduction of current by said junctions causing a decrease in an input signal at the base of the base drive transistor*, to limit the amount of current entering the base of the transistor such that the transistor is prevented from operating at a more saturated point beyond the desired operating range *and to increase efficiency of operation of the circuit*; and further comprising:

means for receiving a drive signal related to the current conducted by the transistor and for responsively causing the base current to vary to prevent the transistor from operating at a less saturated point outside of the desired operating range.

*33. In a circuit including a transistor for connection to a load, the transistor having a plurality of emitters, at least one collector and a base, and operable at a chosen point in saturation defined by a ratio of collector current to base current, a circuit for maintaining the transistor at an operating point within a desired operating range of the chosen point in saturation over a desired range of collector currents and operating temperatures, comprising:*

*means for generating a drive signal related to the peak current conducted by the transistor;*

*base drive means responsive to said drive signal for variably providing sufficient base current to the transistor to prevent the transistor from operating at a less saturated point outside the desired operating range; and*

*means including at least one emitter of the transistor connected to said base drive means for sensing the depth of saturation of the transistor, said emitter being adapted to conduct a current when the transistor reaches a predetermined depth of saturation whereby the current entering the base of the transistor is adjusted to prevent the transistor from operating at a more saturated point outside the desired operating range.*

*34. In a circuit including a transistor for connection to a load, the transistor having a plurality of emitters, at least one collector and a base, and operable in saturation such* that the transistor has a forced current gain, a circuit for maintaining the forced current gain of the transistor within a desired range between a maximum and a minimum forced current again over a desired range of collector currents and operating temperatures, comprising:

means for generating a drive signal related to the peak current conducted by the transistor; and base drive means responsive at least in part to said drive signal for varying the magnitude of base current provided to the transistor to prevent the forced current gain of the transistor from exceeding the desired maximum forced current gain; wherein at least one emitter of the transistor is connected to said base drive means, said emitter being adapted to conduct a current when the transistor reaches a predetermined depth of saturation for limiting the amount of current entering the base of the transistor to prevent the forced current gain of the transistor from being less than the desired minimum forced current gain.

35. In a circuit including a transistor for connection to a load, the transistor having at least one collector, at least two emitters and a base, and operable within a desired range of a chosen point in saturation defined by a ratio of collector current to base current, a circuit comprising:

means for receiving a drive signal related to the peak current conducted by the transistor, and for responsively providing a variable base current to the transistor to prevent the transistor from operating at a less saturated point outside of the desired operating range; and at least one emitter of the transistor connected to said base current providing means, said emitter being adpated for conducting a current to adjust the amount of base current entering the base of the transistor to limit the depth of saturation of the transistor.

36. In a switching regulator circuit including a switching transistor having at least one collector, at least one emitter and a base, the switching transistor operable at a chosen point in saturation defined by a ratio of collector current to base current, and further operable over a desired range of collector currents and operating temperatures, a drive circuit comprising:

means for generating a first base current sufficient to drive the switching transistor to an operating point within the desired range of the chosen point of operation throughout a portion of the desired range of collector currents and operating temperatures;

means for variably generating a second base current the magnitude of which is related to the peak current conducted by the switching transistor; and means for combining and providing to the switching transistor the first and second base currents; wherein the first and second base currents maintain the switching transistor at an operating point in saturation within a desired range of the chosen point in saturation throughout the desired range of collector currents and operating temperatures.

37. In a switching voltage regulator curcuit of the type including (1) a switching transistor having at least one collector, at least one emitter and a base, the switching transistor operable at a chosen point in saturation defined by a ratio of collector current to base current and over a desired range of collector currents and operating temperatures, and (2) a circuit coupled for varying the on and off duty cycle of the switching transistor to produce a regulated output voltage in response to a control signal, wherein the control signal is generated by comparing (a) a signal indicative of a current conducted by the switch to (b) an error signal indicative of a difference between a feedback signal that is proportional to the regulated output voltage and a reference signal, a drive circuit comprising:

means for generating a first base current sufficient to drive the switching transistor to an operating point within the desired range of the chosen point of operation throughout a portion of the desired range of collector currents and operating temperatures;

means responsive to the error signal for variably generating a second base current; and means for combining and providing to the switching transistor the first and second base currents; wherein the first and second base currents maintain the switching transistor at an operating point in saturation within a desired range of the chosen point in saturation throughout the portion of the desired range of collector currents and operating temperatures.

38. A circuit for operating a transistor within a desired range of a chosen point in saturation, the transistor having a base, at least one collector and at least one emitter, comprising:

a base drive transistor for providing base current to the transistor to drive the transistor into saturation, the base drive transistor having a base, at least one collector and at least one emitter;

a first diode-junction for producing a first diode voltage; and a second diode-junction for producing a second diode voltage; wherein said first and second diode-junctions, a base-emitter circuit of said base drive transistor, and a base-collector circuit of the transistor are connected serially in a loop such that said first and second diode-junctions are in phase with one another, in phase opposition to the base-emitter junction of the base drive transistor, and in phase opposition to the forward voltage drop of the base-collector circuit of the transistor when the transistor is in saturation;

whereby the first and second diode-junctions conduct a current when the base-collector forward voltage of the transistor reaches a predetermined value to limit the amount of current entering the base of the transistor such that the transistor is prevented from operating at a more saturated point beyond the desired operating range; and further comprising:

means for receiving a drive signal related to the peak current conducted by the transistor, and for responsively causing the base current to vary to prevent the transistor from operating at a less saturated point outside of the desired operating range.

39. In a voltage regulator of the type including (1) a power switching transistor having a base, at least one collector and at least one emitter, and (2) a circuit for controlling the on-and-off duty cycle of said switching transistor in response to a control signal generated when a current sense signal indicative of a current being conducted by the switching transistor compares in a predetermined manner to an error signal indicative of a difference between a feedback signal proportional to the regulated output voltage and a reference signal, a circuit for operating the switching transistor within a desired range a chosen point in saturation, said circuit comprising:

a base drive transistor for providing base current to the transistor to drive the transistor into saturation, the base drive transistor having a base, at least one collector and at least one emitter;

a first diode-junction for producing a first diode voltage; and a second diode-junction for producing a second diode voltage; wherein said first and second diode-junctions, a base-emitter circuit of said base drive transistor, and a base-collector circuit of the transistor are connected serially in a loop such that said first and second diode-junctions are in phase with one another, in phase opposition to the base-emitter junction of the base drive transistor, and in phase opposition to the forward voltage drop of the base-collector circuit of the transistor when the transistor is in saturation;

whereby the first and second diode-junctions conduct a current when the base-collector forward voltage of the transistor reaches a predetermined value to limit the amount of current entering the base of the transistor such that the transistor is prevented from operating at a more saturated point beyond the desired operating range; and further comprising:

additional means for receiving said error signal and for responsively causing the base current to vary to prevent the transistor from operating at a less saturated point outside of the desired operating range.

40. The circuit of claim 33, 34, 35 or 38, wherein said drive signal determines the peak current conducted by the transistor.

41. The circuit of claim 37 or 39, wherein said error signal determines the peak current conducted by said switching transistor.

42. The circuit of claim 36, wherein said means for variably generating the second base current is responsive to a signal that determines the peak current to be conducted by the switching transistor.

43. The circuit of claim 42, wherein said switching transistor is used to implement a switching voltage regulator for producing a regulated voltage, and wherein said signal is generated by a circuit including an error amplifier that compares (a) a current conducted by the switching transistor to (b) an error signal indicative or a difference between a feedback signal that is proportional to the regulated output voltage and a reference signal.

44. The circuit of claim 32 or 38, wherein the base drive means operates to prevent the transistor from dropping out of saturation.

45. The circuit of claim 36, further comprising an emitter of said switching transistor adapted to limit the depth of saturation of the switching transistor.

46. The circuit of claim 36, further comprising a circuit coupled to sense when the base-collector junction of said switching transistor is forward-biased to the desired extent, and to responsively limit the depth of saturation of the switching transistor.

47. The circuit of claim 22, wherein said means for combining includes a base drive transistor, and wherein said circuitry for adjusting comprises first and second diode junctions connected serially in a loop with a base-collector circuit of said switching transistor and a base-emitter circuit of said base drive transistor, said first and second diode junctions being adapted to allow the base-collector junction of said switching transistor to become forward-biased to a desired extend to limit the depth of saturation of the switching transistor.

48. The circuit of claim 27, wherein said means for combining includes a base drive transistor, and wherein said circuitry for adjusting further comprises first and second diode junctions connected serially in a loop with a base-collector circuit of said switching transistor and a base-emitter circuit of said base drive transistor, said first and second diode junctions being adapted to allow the base-collector junction of said switching transistor to become forward-biased to a desired extent to limit the depth of saturation of the switching transistor.

49. The circuit of claim 22, 27, 47 or 48, wherein the magnitude of the second base current is related to the peak current conducted by the switching transistor.

50. The circuit of claim 1, wherein said saturation sensing means further comprises:

means connected to the base and a collector of the transistor for sensing the base-collector forward voltage drop of the transistor, and for conducting at least a portion of the current provided to the base of the transistor when the base-collector forward voltage drop of the transistor reaches a predetermined value.

51. The circuit of claim 11, wherein said saturation sensing means further comprises:

means connected to the base and collector of the transistor for sensing the base-collector forward voltage drop of the transistor, and for conducting at least a portion of the current provided to the base of the transistor when the base-collector forward voltage drop of the transistor reaches a predetermined value.

52. The circuit of claim 1, wherein the drive signal is related to the peak current conducted by the transistor.

* * * * *